United States Patent
Fan Chiangi et al.

[11] Patent Number: 5,422,585
[45] Date of Patent: Jun. 6, 1995

[54] APPARATUS FOR GENERATING AN OUTPUT SIGNAL OF A DESIRED PULSE WIDTH

[76] Inventors: Yung F. Fan Chiangi; Kun M. Lee, both of No. 6, Feng Shu Tsuen, Kweishan, Taoyuan, Taiwan, Prov. of China

[21] Appl. No.: 126,235
[22] Filed: Sep. 24, 1993
[51] Int. Cl.⁶ .................. H04L 25/08; H03K 5/13; H03K 7/00
[52] U.S. Cl. .................. 327/170; 327/172; 327/173; 327/174; 327/306
[58] Field of Search .............. 307/263, 264, 265, 266, 307/267; 327/170, 172, 173, 174, 306

[56] References Cited
U.S. PATENT DOCUMENTS

| | | |
|---|---|---|
| 4,598,412 | 7/1986 | Yoshida .................. 307/265 |
| 4,994,687 | 2/1991 | Fujii et al. .................. 307/267 |
| 5,059,812 | 10/1991 | Witt et al. .................. 307/265 |
| 5,124,573 | 6/1992 | Wona .................. 307/267 |

*Primary Examiner*—William L. Sikes
*Assistant Examiner*—Fetsum Abraham
*Attorney, Agent, or Firm*—Fish & Richardson

[57] ABSTRACT

A apparatus for generating an output signal of a desired pulse width is disclosed. The apparatus comprises a flip-flop, a delay circuit and a clear circuit. The flip-flop, in response to a first trigger signal, outputs the output signal at an output terminal. The delay circuit generates a second trigger signal by delaying the output signal for a predetermined amount of time. The clear circuit, in response to the second trigger signal, generates a clear signal to said flip-flop in order to clear the output signal. The desired pulse width of the output signal is controlled by the predetermined amount of time set in the delay circuit.

5 Claims, 1 Drawing Sheet

APPARATUS FOR GENERATING AN OUTPUT SIGNAL OF A DESIRED PULSE WIDTH

BACKGROUND OF THE INVENTION

The present invention relates to a signal generating apparatus, and, in particular, relates m an apparatus for generating an output signal of a desired pulse width.

In the field of electrical system, e.g. a monitor control system, a signal of a desired pulse width is frequently needed to be the input signal of other circuits of the electrical system.

One of the conventional approaches uses a resistor capacitor circuit together with a monostable multivibrator which responds to a trigger signal to output a signal of the desired pulse width at the output terminal of the monostable multivibrator. The desired pulse width of the signal is determined by the RC constant of the resistor-capacitor circuit. However, this approach is not easily implemented on a digital integrated circuit since the circuit of the monostable multivibrator is in analog nature.

SUMMARY OF THE INVENTION

The present invention provides a signal generating apparatus from which a signal of a desired pulse width is obtained.

The apparatus of the invention includes a flip-flop, a delay circuit and a clear circuit. The flip-flop, in response to a first trigger signal, outputs the output signal at an output terminal. The delay circuit generates a second trigger signal by delaying the output signal for a predetermined amount of time. The clear circuit, in response to the second trigger signal, generates a clear signal to the flip-flop in order to clear the output signal. The desired pulse width of the output signal is controlled by the predetermined amount of time delayed in the delay circuit.

The invention may be further understood by the following derailed descriptions on the invention along with the appended drawings.

DETAILED DESCRIPTION OF THE INVENTION

Figure 1:
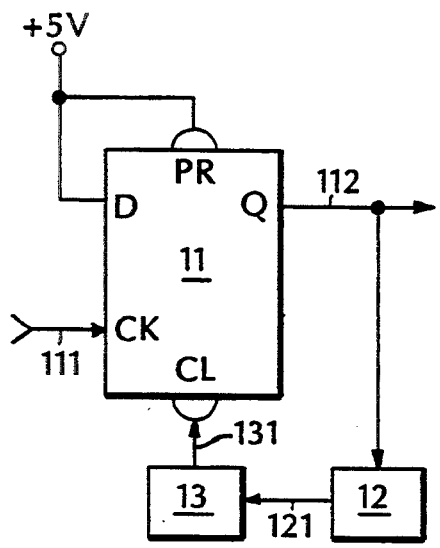
FIG. 1 shows basic circuit block in accordance with the invention.

Referring to FIG. 1, the invention includes a flip-flop 11, a delay circuit 12 and a clear circuit 13.

Figure 2:
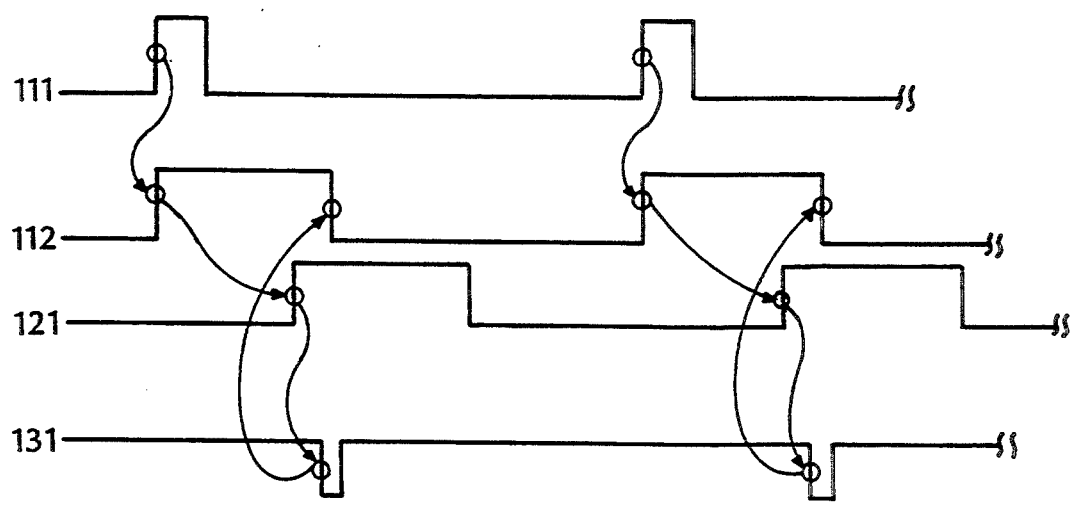
FIG. 2 shows the timing relationship of the signals in FIG. 1.

The flip-flop 11, in response to a first trigger signal 111, generates an output signal 112 at the output terminal (Q). The timing is shown in FIG. 2.

The delay circuit 12 inputs the output signal 112 and generates a second trigger signal 121 by delaying the output signal 112 for a predetermined amount of time. The predetermined amount of time is determined by adjusting the parameters in the delay circuit 12. The associated timing is shown in FIG. 2.

The clear circuit 13, in response to the second trigger signal 121, generates a clear signal 131 to clear the output signal 112 from the flip-flop 11. The associated timing is shown in FIG. 2.

By altering the value of the parameters within the delay circuit 12, the pulse width of the output signal 112 is therefore changed as desired.

The delay circuit 12 may be embodied in several different ways. When a programmable delay circuit is utilized, the desired pulse width of the output signal 112 will not be totally continuous. However, through the implementation of this kind, the whole circuit of the invention shown in FIG. 1 can be fabricated in an integrated circuit.

Figure 3:
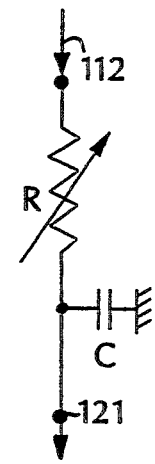
FIG. 3 shows one preferred embodiment of the delay circuit of FIG. 1.

One preferred embodiment of the delay circuit 12, disclosed in FIG. 3, has a variable resistor (R) and capacitor (C). Adjusting the variable resistor continuously changes the RC constant of the circuit which results in a continuous change of the delay time of the delay circuit 12. The pulse width of the output signal 112 is thereby changed continuously as desired. If this embodiment is employed, the whole circuit of the invention except the delay circuit 12 can be implemented on an integrated circuit and the delay circuit 12 shown in FIG. 3 is coupled to the input/output pins of the implemented integrated circuit.

The flip-flop 11 has a clock input terminal inputting the first trigger signal 111, a data terminal and preset terminal both coupled to a reference voltage (+5V), and a clear terminal inputting the clear signal 131. Instead of the shown D type flip-flop 11, other types of flip-flop may also be used along with required modifications to the associated circuits to achieve the purpose of the invention. The modifications to the apparatus of the invention which is equivalent to a person skilled in the art are still within the intended scope of protection of the invention which is defined by the following appended claims.

What is claimed is:

1. An apparatus for generating an output signal of a desired pulse width, comprising:
    a flip-flop, in response to a first trigger signal, for outputting said output signal at an output terminal;
    a delay circuit for generating a second trigger signal by delaying said output signal for a predetermined amount of time;
    a clear circuit, in response to said second trigger signal, for generating a clear signal to said flip-flop in order to clear said output signal;
    whereby the desired pulse width of said output signal is controlled by said predetermined amount of time.

2. The apparatus as recited in claim 1, wherein the flip-flop having a clock input terminal for receiving said first trigger signal, a data terminal and preset terminal both coupled to a reference voltage, and a clear terminal for receiving said clear signal.

3. The apparatus as recited in claim 2, wherein the flip-flop is a D-type flip-flop.

4. The apparatus as recited in claim 1, wherein the delay circuit comprising a resistor-capacitor circuit.

5. The apparatus as recited in claim 4, wherein said resistor-capacitor circuit includes a variable resistor and wherein said predetermined amount of time is controlled by said variable resistor.

* * * * *